(12) United States Patent
Dey

(10) Patent No.: US 6,856,203 B2
(45) Date of Patent: Feb. 15, 2005

(54) PHASE LOCK LOOP WITH CONTROLLABLE LOCK TIME

(75) Inventor: Saudas Dey, New Delhi (IN)

(73) Assignee: STMicroelectronics PVT. Ltd., Uttar Pradesh (IT)

(*) Notice: Subject to any disclaimer, the term of this patent is extended or adjusted under 35 U.S.C. 154(b) by 17 days.

(21) Appl. No.: 10/356,664

(22) Filed: Jan. 31, 2003

(65) Prior Publication Data

US 2003/0155981 A1 Aug. 21, 2003

(30) Foreign Application Priority Data

Jan. 31, 2002 (IN) ........................................ 83/DEL/2002

(51) Int. Cl.[7] .................................................. H03L 7/00
(52) U.S. Cl. ......................................... 331/16; 327/156
(58) Field of Search ............................... 331/16, 15, 17, 331/25; 327/156, 147, 157, 148

(56) References Cited

U.S. PATENT DOCUMENTS

| | | | |
|---|---|---|---|
| 6,163,184 A | | 12/2000 | Larsson ........................ 327/156 |
| 6,483,390 B2 | * | 11/2002 | Welland ..................... 331/36 C |
| 2003/0206066 A1 | * | 11/2003 | Harwood ....................... 331/17 |

* cited by examiner

*Primary Examiner*—Robert Pascal
*Assistant Examiner*—Joseph Chang
(74) *Attorney, Agent, or Firm*—Lisa K. Jorgensom; Allen, Dyer, Doppelt, Milbrath & Gilchrist, P.A.

(57) ABSTRACT

An improved phase locked loop (PLL) includes a frequency multiplier and a voltage controlled oscillator (VCO). The VCO includes a control circuit for automatically adjusting its initial free-running frequency in response to changes in an integer divider value. The adjusting is done so that the frequency difference between the initial free-running frequency divided by the integer divider value and a reference frequency is maintained at an approximately constant value. This results in a controllable lock time that is independent of the integer divider value.

24 Claims, 4 Drawing Sheets

PHASE LOCK LOOP WITH CONTROLLABLE LOCK TIME

FIELD OF THE INVENTION

The invention relates to a phase locked loop (PLL) that provides a controllable lock time independent of the frequency divider value. The PLL also provides bandwidth and damping factors that are independent of the frequency divider value when the loop comprises a current controlled charge pump and a first order loop filter.

BACKGROUND OF THE INVENTION

Phase locked loops are critical circuit elements used in various applications including clock generation and clock recovery. FIG. 1 shows the block diagram of a conventional PLL circuit that includes a crystal oscillator 1 for generating a low noise reference frequency clock signal ($f_{ref}$). The reference frequency clock signal $f_{ref}$ is supplied to one input of a phase detector 3 having a second input that is supplied to the output ($f_{out}/N$) of a divide-by-N circuit 8, where N is the frequency divider value. The output of the phase detector 3 supplies an up-count or a down-count signal to a charge pump circuit 4. The charge pump circuit 4 then supplies a current output to charge or discharge a filter network 5 whose output (in the form of a control voltage) is supplied to the input of a VCO 6, which produces an output clock signal $f_{out}$ having a frequency equal to ($N*f_{ref}$). The output clock signal $f_{out}$ is supplied to a divide-by-N network 8 to produce a feedback signal equal to $f_{out}/N$ which is supplied to the phase detector 3.

Another important aspect of a PLL characteristic is to have low-jitter at the output clocks. With reference to FIG. 1, two identified noise sources which may cause jitter in the output clock signal $f_{out}$ is noise $n_{ref}$ 2 associated with the reference frequency $f_{ref}$ and noise $n_{vco}$ 7 associated with the VCO 6. Typically, the noise $n_{vco}$ 7 is much greater than the noise $n_{ref}$ 2 and is the leading cause of jitter at the PLL output. When the VCO noise dominates, [R. E. Best, "Phase Locked Loops", second edition, McGraw Hill Publications, 1993] the output noise associated with the VCO (and hence, the output clock signal $f_{out}$) can be reduced by increasing the PLL bandwidth $\omega_{BW}$.

At the start of the locking procedure, the VCO 6 starts oscillating with a start-up frequency, which is the free-running frequency of the VCO. This frequency changes with time under control of the feedback loop till the PLL becomes locked to the desired frequency. The time that a PLL takes to settle to its stable or locked state, starting from an unlocked and free-running state, is termed as the lock-time. A small lock-time is always a desirable feature. When the PLL is locked, the frequency difference between the reference clock ($f_{ref}$) and the feedback clock ($f_{out}/N$) is zero.

A basic criteria to minimize the lock-time is to minimize the frequency difference between $f_{ref}$ and ($f_{out}/N$), so that a minimum time is required for the PLL to reduce the difference to zero. If the start-up frequency or the free-running frequency of the VCO 6 is designated as $f_{fr}$, where $f_{fr}=f_{out}$ at t=0, then the initial frequency difference seen by the PLL, which has to be reduced to zero, could be expressed as $\Delta\omega=|f_{ref}-(f_{fr}/N)|$. As can be seen, $\Delta\omega$ is a function of N. Therefore, if the VCO is always started with frequency $f_{fr}$ irrespective of the value N, then the frequency difference increases with N. This results in an increasing lock time, as one goes from a lower to a higher frequency divider value N. In the worst case the PLL may not get locked at all [R. E. Best, "Phase Locked Loops", second edition, McGraw Hill Publications, 1993].

The lock time also depends on the frequency or phase step-response-time of the system, which is a function of the damping factor $\zeta$ and the natural frequency $\omega_n$ of the PLL system. The transient, created by the frequency or phase step, is minimum if $\theta=0.7$ and if the natural frequency $\zeta_n$ is large.

Thus, to achieve a constant and small lock-time, and to maintain an optimized settling and noise characteristic, an optimally designed PLL should keep the designed value of $\Delta\omega$ and $\omega_{BW}$ (and hence, $\omega_n$ and $\zeta$) independent of the division ratio N throughout its operation. However, in many applications, the division ratio N can not always be set to an optimum value because in those applications N is varied during the operation of the system. Common examples are clock-generator circuits used in microprocessors and communication systems, and PLL based frequency synthesizers. In these applications variation in N results in a non-optimal performance of the PLL and causes poor lock-time and settling behavior, apart from increasing the jitter in the VCO output.

There are no known techniques for making the PLL lock time independent of the frequency divider value or for minimizing the PLL lock time. U.S. Pat. No. 6,163,184 describes an improved phase locked loop (PLL) in which the bandwidth is independent of the frequency divider value. In this approach, the charge-pump current $I_{cp}$ or VCO gain $K_{VCO}$, or loop-filter resistance R, can be programmed to vary as a function of N to render the bandwidth of the PLL independent of the divider ratio N. Implementation of this approach keeps the PLL bandwidth independent of the divider ratio N, but without maintaining and keeping the lock-time small as the count increases. The programmability is controlled by adjusting the current bias of the charge-pump or the VCO. However, this approach does not address the problem of minimizing or reducing the lock time.

SUMMARY OF THE INVENTION

An object of the present invention is to maintain a small lock-time and an optimum settling behavior irrespective of a divider-ratio increment, while simultaneously reducing the noise-manifested-jitter present at the PLL output.

Another object of the invention is to provide a phase locked loop (PLL) in which the lock time is independent of the frequency divider value.

Yet another object of the invention is to provide a PLL in which the bandwidth and damping factor are independent of the frequency divider value when the loop comprises a current control charge pump and a single order loop filter, thereby reducing jitter at the PLL output.

These and other objects, advantages and features in accordance with the invention are provided by a phase locked loop (PLL) comprising a frequency multiplier including a voltage controlled oscillator (VCO) having one input connected to a reference frequency signal, and a second input connected to a programmable frequency divider network. The programmable frequency divider network is programmable for dividing an input frequency by an integer value N. The output of the VCO is connected to the input of the programmable frequency divider network while producing an output signal having a frequency equal to the product of the reference frequency and the integer divider value N.

The VCO includes a control circuit for automatically adjusting its initial free-running frequency in response to changes in the integer divider value such that the frequency difference between the initial free-running VCO frequency divided by the integer divider value and the reference-frequency is maintained at an approximately constant defined value. This results in a controllable lock time of the PLL that is independent of the integer divider value.

The bandwidth and damping factor are also independent of the integer divider value when the frequency multiplier comprises a current controlled charge pump and a single order loop filter, thereby reducing jitter at the PLL output. The VCO initial free-running frequency is adjusted to provide a reduced lock time independent of the integer divider value.

The VCO may be a ring oscillator comprising a number of voltage-controlled delay elements connected in a loop with the initial free-running frequency being determined by the combined delay of the number of delay elements in the loop while operating at the initial control voltage.

The initial free-running VCO frequency may be altered by varying the effective number of delay elements connected in the loop. The number of delay elements in the loop may be altered by selectively bypassing the required number of delay elements while forming the loop. The delay elements are selectively bypassed using a multiplexer circuit having each input connected to the output of one of the decoder elements, and its output connected to the feedback path of the loop.

The present invention further provides a method for improving a phase locked loop (PLL) by automatically adjusting the initial free-running frequency of its voltage controlled oscillator (VCO) in response to changes in the value of the integer frequency divider in the loop so that the initial free-running frequency divided by the integer divider value is maintained at an approximately constant controllable difference relative to the reference frequency. This provides a controllable lock time that is independent of the integer divider value.

The bandwidth and damping factor are also made independent of the integer divider value when the PLL uses a current operated charge pump and a single order loop filter, thereby reducing jitter at the PLL output. The initial free-running VCO frequency may be adjusted to provide a reduced lock time independent of the integer divider value.

The method is applied to a PLL using a VCO that may be a ring oscillator comprising a number of voltage controlled delay elements connected in a loop, wherein the initial free-running frequency is altered by varying the number of delay elements. The number of delay elements may be altered by selectively bypassing the required number of delay elements in the loop.

BRIEF DESCRIPTION OF THE DRAWINGS

The invention will now be described with reference to the accompanying drawings.

DETAILED DESCRIPTION OF THE PREFERRED EMBODIMENTS

Figure 1:
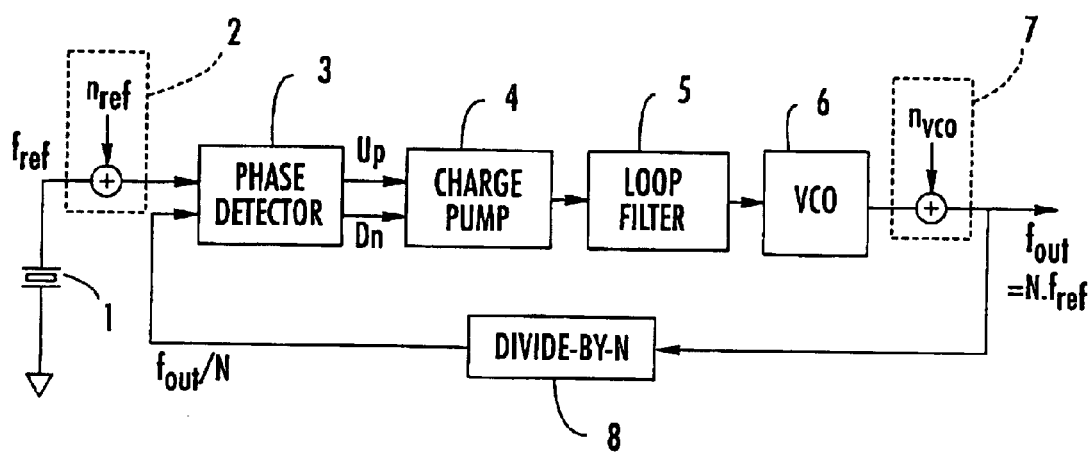
FIG. 1 is a schematic block diagram of a conventional PLL according to the prior art.
Figure 2:
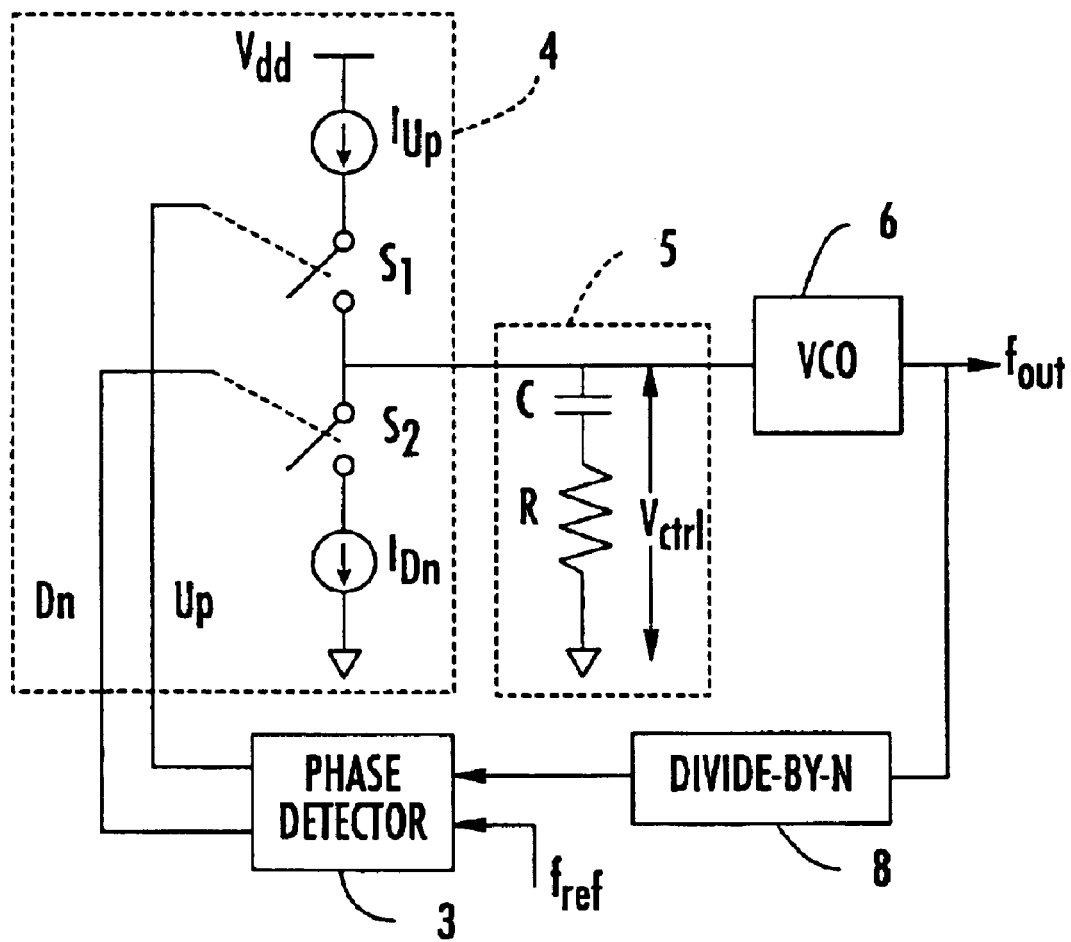
FIG. 2 is a schematic diagram of the charge pump and loop filter sections of a conventional PLL according to the prior art.

FIG. 2 shows the schematic diagram of a current control charge pump and single order loop filter. Complimentary outputs 'Dn' and 'Up' from the phase detector controls switches S1 & S2 to provide a charging current $I_{up}$ or a discharging current $I_{dn}$ to the capacitor C and to the resistor network R of the loop filter 5 for generating a control voltage $V_{ctrl}$ at the input of the VCO 6.

The free-running frequency $\omega_n$ and the damping factor $\zeta$ of a second order PLL system (comprising a first order loop filter and a first order VCO block) are expressed as:

$$\omega_n = \sqrt{\frac{\omega_{BW}}{CR}} \quad (1)$$

$$\zeta = \frac{1}{2}\sqrt{\omega_{BW}CR} \quad (2)$$

where C and R are the filter components and $\omega_{BW}$ is the loop-gain bandwidth of the PLL.

Figure 3:
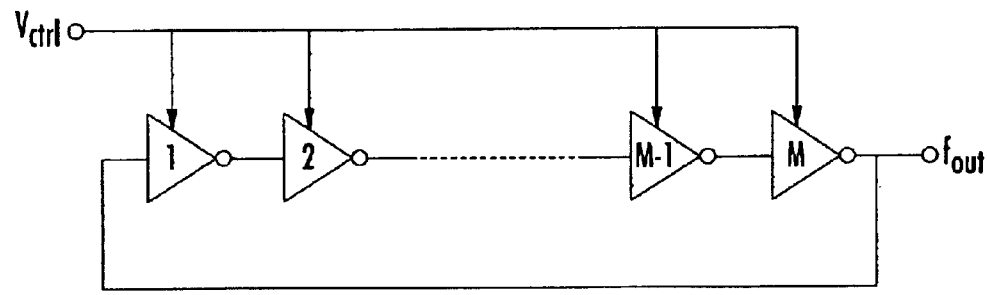
FIG. 3 is a schematic diagram of a conventional ring oscillator based VCO according to the prior art.

FIG. 3 shows a conventional ring oscillator VCO. Delay cells 1 to M are connected in a loop with the output of the final delay cell M, which is also the final output of the VCO, connected back to the input of the first delay cell 1. Each delay cell is provided with a common control voltage $V_{ctrl}$, which controls the delay of the cell. Typically, the total number of delay cells M is an odd value integer.

The operating frequency of such a VCO can be expressed as:

$$f_{VCO}\Big|_{Vctrl=V0} = \frac{1}{2M\Delta} \quad (3)$$

where $f_{VCO|Vctrl=V0}$ is the frequency of the VCO when the control voltage $V_{ctrl}$ is equal to $V_0$ volts. The voltage $V_0$ is the control voltage at the VCO input at the PLL start-up. M is the (odd) number of delay-cells included in the ring oscillator chain, and $\Delta$ is the delay per delay-cell when the control voltage is equal to $V_0$.

When the VCO control voltage $V_{ctrl}$ reaches 1.0 volt above $V_0$ (i.e., when $V_{ctrl}=V_0+1=V_1$), assume that the per delay-cell delay increases by $\zeta$. In such a situation, the operating frequency of the VCO can be expressed as:

$$f_{VCO}\Big|_{Vctrl=V1} = \frac{1}{2M(\Delta+\delta)} \quad (4)$$

Using (3) and (4), the VCO gain $K_{VCO}$ can, therefore, be expressed as:

$$K_{VCO} = \frac{\delta}{2M(\Delta^2+\delta\Delta)} \quad (5)$$

The loop-gain bandwidth, or simply the bandwidth, of a PLL system having a charge pump circuit 4 and a first-order loop filter 5 may be expressed as follows:

$$\omega_{BW} = \frac{I_{CP}K_{VCO}R}{N} \quad (6)$$

where $K_{VCO\ is\ the\ gain\ of\ the\ VCO,\ ICP}$ is the charge pump current produced at the output of the charge pump 4 which flows into or out of (where, it is assumed that $I_{DN}=I_{UP}=I_{CP}$) the filter network 5, N is the division ratio of the feedback divider network 8, and R is the resistance of the filter network 5.

The filter network also includes an integrating capacitor C. As evident from (1) and (2), the natural frequency $\omega_n$ and the damping factor ζ are both a function of N. Since, the PLL bandwidth $\omega_{BW}$ is inversely proportional to N, $\omega_n$ and ζ decrease as N increases. Thus, except for the smallest value of N, the PLL will have a suboptimal settling time, and hence a non-minimal lock-time. That is, the greater N is made, the lower $\omega_{BW}$ is going to be, and as a result $\omega_n$ and ζ will drift from their pre-designed optimized values.

Figure 4:
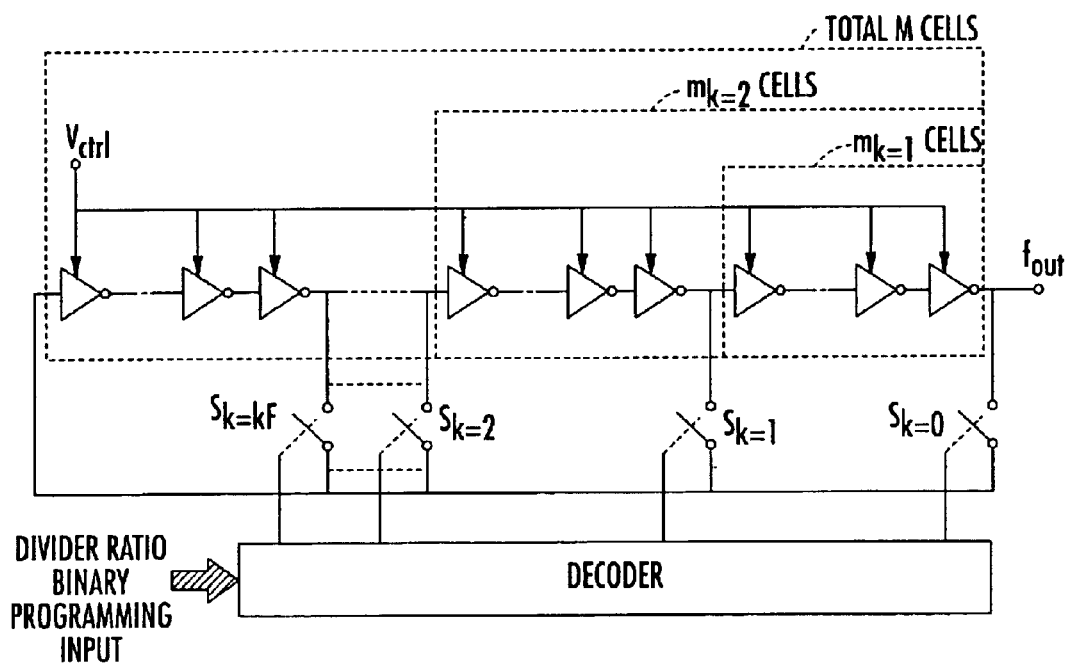
FIG. 4 is a schematic diagram of a programmable ring oscillator based VCO according to the invention.

FIG. 4 shows the modification of the VCO, according to the invention, where the PLL includes a programmable delay length of a ring-oscillator based VCO, programmed to be a function of N, for selectively modifying the initial free-running frequency of the VCO and to make the transfer function of the PLL a function of the divider ratio N.

The free-running VCO clock frequency is made a function of the divider ratio N. This is done by making the free-running VCO clock frequency $f_{fr}$ equal to $(N/N_I)*f_{I,fr}$ where $f_{I,fr}$ is the free-running VCO clock frequency when $N=N_I$. $N_I$ is the smallest allowed divider ratio. Since, the ratio $(f_{I,fr}/N_I)$ is a constant and, assume equal to $C_1$, the frequency step (Δω) at the time of the PLL starting from an unlocked and free-running state becomes independent of the divider ratio N and can be expressed as:

$$\Delta\omega = \left| f_{ref} - \frac{f_{fr}}{N} \right| = |f_{ref} - C_1| \qquad (7)$$

As can be seen from (7), Δω is now no longer a function of N and always provides a reduced constant frequency difference to the PLL. This maintains a small lock-time that is independent of the divider ratio N. Moreover, the VCO gain $K_{VCO}$ also simultaneously becomes a function of the divider ratio N. In fact, $K_{VCO}$ becomes equal to $(N/N_I)*K_{I,VCO}$, where $K_{I,VCO}$ is the VCO gain when $N=N_I$. Since the ratio $(K_{I,VCO}/N_I)$ is constant and, assume equal to $C_2$, the bandwidth $\omega_{BW}$ of the PLL may be expressed as:

$$\omega_{BW} = \frac{I_{CP}K_{VCO}R}{N} = C_2 I_{CP} R \qquad (8)$$

Thus, PLL circuits formed in accordance with the invention have bandwidths which are independent of the divider ratio N. Assume that (5) is the gain of the VCO when the divider ratio $N=N_I$ ($N_I$ is the smallest allowed divider ratio), and let this gain be designated as $K_{I,VCO}$. Also, assume that when the divider ratio N is incremented by an integral value to $N_I+1$, m number of delay-cells are removed from the ring-oscillator chain, thereby modifying (3) and (4), and resulting in (9) and (10):

$$f_{VCO}\Big|_{Vctrl=V0} = \frac{1}{2(M-m)\Delta} \qquad (9)$$

$$f_{VCO}\Big|_{Vctrl=V1} = \frac{1}{2(M-m)(\Delta+\delta)} \qquad (10)$$

From (9) and (10), when the divider ratio is N+1, the VCO gain can be expressed as:

$$K_{VCO} = \frac{\delta}{2(M-m)(\Delta^2+\delta\Delta)} \qquad (11)$$

It can be seen from (3) and (9) that the VCO frequency at $V_{ctrl}=0$ is the same as the start-up (or initial free-running) VCO frequency at $N=N_I$ and $N=N_I+1$, respectively.

Therefore, using (3) and (9), the start-up (or initial free-running) frequency at $N=N_I$ and $N=N_I+k$ (k is an integer) can be defined as:

$$f_{fr} = \frac{M}{M-m} f_{I,fr} \qquad (12)$$

where $f_{I,fr}$ is the initial free-running frequency when $N=N_I$, and $f_{fr}$ is the initial free-running frequency when $N=N_I+k$.

When $N=N_I$, the difference between the initial free-running VCO frequency $f_{I,fr}$ and the reference frequency fret can be expressed as:

$$\Delta\omega|_{N_I} = \left| f_{ref} - \frac{f_{I,fr}}{N_I} \right| \qquad (13)$$

Similarly, when $N=N_I+k$, the difference between the initial free-running VCO frequency $f_{fr}$ and the reference frequency fret can be expressed as:

$$\Delta\omega|_{N_I+k} = \left| f_{ref} - \frac{f_{fr}}{N_I+k} \right| \qquad (14)$$

To keep Δω the same in both cases, (13) and (14) have to be equal to each other. Equalizing (13) and (14) results in the following expression relating $f_{I,fr}$ and $f_{fr}$:

$$f_{fr} = \frac{N_I+k}{N_I} f_{I,fr} \qquad (15)$$

Using (12) and (15), the required number of delay-cells to be removed from the delay-chain can be expressed as:

$$m = \frac{Mk}{N_I+k} \qquad (16)$$

Therefore, if m number of delay cells, as given by (16), are removed from the delay chain of the ring-oscillator based VCO while moving from $N_I$ to $N_I+k$, then Δω will remain constant and independent of the divider ratio N.

Applying (16) and (12) in (14), results in the following expression:

$$\Delta\omega|_{N_I+k} = \left| f_{ref} - \frac{f_{I,fr}}{N_I} \right| = |f_{ref} - C_2| \qquad (17)$$

where $C_2=(f_{I,fr}/N_I)$. Therefore, the frequency step Δω at the start-up of the PLL from an unlocked and free-running condition is constant, thus maintaining the lock-time to a pre-designed small value, irrespective of the divider ratio N.

It can also be seen from (5) and (11) that while moving from N to N+1, $K_{VCO}$ increases by a factor $F_K$, expressed as:

$$F_K = \frac{M}{M-m} \qquad (18)$$

To achieve the relationship (8), it is necessary to maintain $K_{VCO}=(N/N_I)*K_{I,VCO}$, where $N=N_I+k$, and k is an integer.

Therefore, the following expression has to be valid:

$$\frac{K_{VCO}}{N} \equiv \frac{F_K K_{I,VCO}}{N_I + k} = \frac{K_{I,VCO}}{N_I} \quad (19)$$

On simplifying (19), $$m = \frac{Mk}{N_I + k} \quad (20)$$

As can be seen, (20) is exactly the same as (16) Therefore, while moving from $N_I$ to $N_I$+k, if m number of delay-cells, given by (16) or (20), are removed from the delay chain of the ring-oscillator based VCO, then not only is a constant $\Delta\omega$ achieved, but simultaneously a constant PLL bandwidth which is also independent of N is also achieved.

It can be concluded from the above analysis that to achieve (7), with every integral increment in the smallest allowed divider ratio $N_I$, m number of delay-cells given by (16) have to be removed from the chain of delay-cells used in the ring oscillator based VCO. This methodology of removal of m delay-cells with every increment in N fulfils (8) as well.

In the designed PLL, assume that the starting or lowest allowed count is $N=N_I$ and the final or the highest allowed count is $N=N_F$. Also, assume that the divider ratio integral increment factor k varies from 0 to $k_F$, i.e., when $N=N_I$, k=0 and when $N=N_F$, k=$k_F$. Referring to FIG. 4, it can be seen that switches $S_{k=0}$ to $S_{k=kF}$ are arranged in a predetermined fashion, such that at a time only one switch is activated and completes the ring-oscillator loop by providing as feedback the output to the input.

These switches are controlled by the decoder output, which, in turn, is controlled by the divider ratio programming bits. Therefore, at each count, the binary divider ratio programming bits are first decoded and then the decoded output is used to control a particular switch to include a predetermined set of delay-cells in the ring-oscillator chain.

Assuming the divider ratio starts from $N=N_I$, and at this instance the decoder decodes and selects switch $S_{k=0}$ and closes it, the rest of the switches ($S_{k=1}$ to $S_{k=kF}$) are kept open. Closure of switch $S_{k=0}$ starts the ring-oscillator (and hence, the VCO) with the total M delay cells in the feedback loop. At the next divider ratio count, N increases to $N_{I+1}$ because k increases from 0 to 1. At this instance, the decoder decodes and selects switch $S_{k=1}$, thus removing $m_{k=1}$ cells from the ring-oscillator and starting the VCO with a total M-$m_{k=1}$ delay-cells in the feedback loop.

The value of $m_{k=1}$ can be calculated using (14), which is a function of the design parameters M, $N_I$ and k and, thus placement of the switch $S_{k=1}$ is determined. Care has to be taken, however, to maintain an odd count of the total number of delay cells included in the delay chain for every count. Similarly, for the next divider ratio count, the total $m_{k=2}$ delay cells are removed from the delay chain, and so on for the rest of the counts as well every time removing a suitable number of delay-cells from the delay chain.

Figure 5:
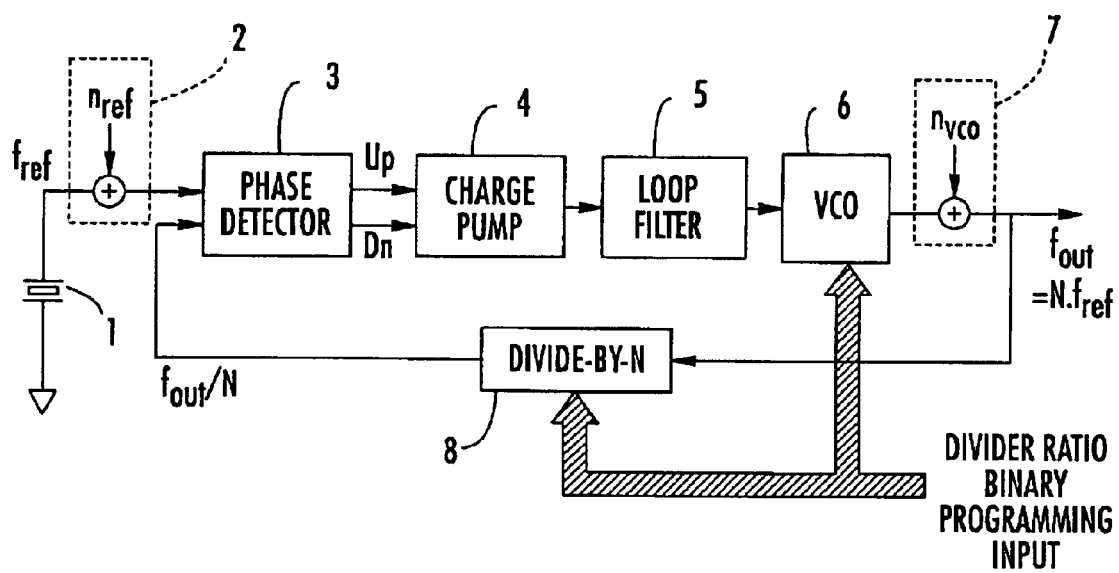
FIG. 5 is a schematic block diagram of an improved PLL according to the invention.

FIG. 5 shows the improved PLL according to the invention. The start-up frequency difference step $\Delta\omega$ and the bandwidth $\omega_{BW}$ of the PLL are made independent of the divider ratio N, whereby the PLL will always run at its minimum pre-designed start-up frequency step and maximum pre-designed bandwidth, thus ensuring a fast settling and lock time, and simultaneously reducing jitter at the PLL output. The PLL includes the voltage controlled oscillator circuit of FIG. 4, the start-up frequency and the gain ($K_{VCO}$) of which may be programmed to be a function of N to provide a constant frequency difference step $\Delta\omega$ and to render the bandwidth of the PLL substantially independent of the divider ratio N. The selected divider value is simultaneously supplied to the divider network and the VCO so that the VCO is adjusted whenever the divider value is changed.

Implementation and realization of the present invention in circuit form is straightforward and could be achieved using conventional circuit blocks. The decoder could be any prior art decoder available, and the switches could be any readily available prior art digital switches, like transmission gates.

That which is claimed is:

1. A phase locked loop (PLL) comprising:

a programmable frequency divider network for dividing an input frequency by an integer value; and a frequency multiplier comprising a voltage controlled oscillator (VCO) and having a first input for receiving a reference frequency, a second input connected to an output of said programmable frequency divider network, and an output connected to an input of said programmable frequency divider network, said frequency multiplier generating at the output an output signal having a frequency equal to a product of the reference frequency and the integer value;

said VCO comprising a control circuit for adjusting an initial free-running frequency of said VCO in response to changes in the integer value so that a frequency difference between the initial free-running frequency divided by the integer value and the reference frequency is maintained at an approximately constant value, resulting in a controllable lock time that is independent of the integer value.

2. A PLL according to claim 1 wherein said frequency multiplier further comprises a current controlled charge pump and a single order loop filter connected thereto so that a bandwidth and a damping-factor of the PLL are also independent of the integer value for maintaining settling behavior and reducing jitter.

3. A PLL according to claim 1 wherein the initial free-running frequency of said VCO is adjusted to provide a reduced lock time that is independent of the integer value.

4. A PLL according to claim 1 wherein said VCO comprises ring oscillator comprising a plurality of voltage-controlled delay elements connectable in a loop, the initial free-running frequency of said VCO being determined by a combined delay of said voltage-controlled delay elements connected in the loop.

5. A PLL according to claim 4 wherein the initial free-running frequency of said VCO is adjusted by varying the number of said voltage-controlled delay elements connected in the loop.

6. A PLL according to claim 4 wherein the number of said voltage-controlled delay elements connected in the loop is varied by selectively bypassing a required number of delay elements while forming the loop.

7. A PLL according to claim 6 wherein said ring oscillator further comprises:

a decoder having an input for receiving the integer value; and a multiplexer circuit having inputs connected to outputs of said decoder, and outputs connected to said plurality of voltage-controlled delay elements via a feedback path of the loop, said multiplexer circuit for selectively bypassing said voltage-controlled delay elements.

8. A phase locked loop (PLL) comprising:
a programmable frequency divider network for dividing an input frequency by an integer value; and
a frequency multiplier comprising a voltage controlled oscillator (VCO) and having a first input for receiving a reference frequency, a second input connected to an output of said programmable frequency divider network, and an output connected to an input of said programmable frequency divider network, said frequency multiplier generating at the output an output signal having a frequency equal to a product of the reference frequency and the integer value;
said vco comprising a ring oscillator comprising a plurality of voltage-controlled delay elements connectable in a loop, and an initial free-running frequency of said VCO being determined by a combined delay of said voltage-controlled delay elements connected in the loop, resulting in a controllable lock time that is independent of the integer value.

9. A PLL according to claim 8 wherein the initial free-running frequency is adjusted in response to changes in the integer value so that a frequency difference between the initial free-running frequency divided by the integer value and the reference frequency is maintained at an approximately constant value.

10. A PLL according to claim 8 wherein said frequency multiplier further comprises a current controlled charge pump and a filter connected thereto so that a bandwidth and a damping-factor of the PLL are also independent of the integer value for reducing jitter.

11. A PLL according to claim 8 wherein the initial free-running frequency of said VCO is adjusted to provide a reduced lock time that is independent of the integer value.

12. A PLL according to claim 8 wherein the initial free-running frequency of said VCO is adjusted by varying the number of said voltage-controlled delay elements connected in the loop.

13. A PLL according to claim 8 wherein the number of said voltage-controlled delay elements connected in the loop is varied by selectively bypassing a required number of delay elements while forming the loop.

14. A PLL according to claim 8 wherein said ring oscillator further comprises:
a decoder having an input for receiving the integer value; and
a multiplexer circuit having inputs connected to outputs of said decoder, and outputs connected to said plurality of voltage-controlled delay elements via a feedback path of the loop, said multiplexer circuit for selectively bypassing said voltage-controlled delay elements.

15. An integrated circuit comprising:
a phase locked loop (PLL) comprising
a programmable frequency divider network for dividing an input frequency by an integer value, and
a frequency multiplier comprising a voltage controlled oscillator (VCO) and having a first input for receiving a reference frequency, a second input connected to an output of said programmable frequency divider network, and an output connected to an input of said programmable frequency divider network, said frequency multiplier generating at the output an output signal having a frequency equal to a product of the reference frequency and the integer value,
said VCO comprising a control circuit for adjusting an initial free-running frequency of said VCO in response to changes in the integer value so that a frequency difference between the initial free-running frequency divided by the integer value and the reference frequency is maintained at an approximately constant value, resulting in a controllable lock time that is independent of the integer value.

16. An integrated circuit according to claim 15 wherein said frequency multiplier further comprises a current controlled charge pump and a single order loop filter connected thereto so that a bandwidth and a damping-factor of said PLL are also independent of the integer value for reducing jitter.

17. An integrated circuit according to claim 15 wherein said VCO comprises a ring oscillator comprising a plurality of voltage-controlled delay elements connectable in a loop, the initial free-running frequency of said VCO being determined by a combined delay of said voltage-controlled delay elements connected in the loop.

18. An integrated circuit according to claim 17 wherein the initial free-running frequency of said VCO is adjusted by varying the number of said voltage-controlled delay element connected in the loop.

19. An integrated circuit according to claim 17 wherein the number of said voltage-controlled delay elements connected in the loop is varied by selectively bypassing a required number of delay elements while forming the loop.

20. An integrated circuit according to claim 19 wherein said ring oscillator further comprises:
a decoder having an input for receiving the integer value; and
a multiplexer circuit having inputs connected to outputs of said decoder, and outputs connected to said plurality of voltage-controlled delay elements via a feedback path of the loop, said multiplexer circuit for selectively bypassing said voltage-controlled delay elements.

21. A method for generating an output signal from a phase locked loop (PLL) comprising a programmable frequency divider network for dividing an input frequency by an integer value, and a frequency multiplier comprising a voltage controlled oscillator (VCO) having an output connected to an input of the programmable frequency divider network, the method comprising:
providing a reference frequency to a first input of the frequency multiplier, and providing an output of the programmable frequency divider network to a second input of the frequency multiplier, and generating at the output of the frequency multiplier the output signal having a frequency equal to a product of the reference frequency and the integer value; and
adjusting an initial free-running frequency of the VCO in response to changes in the integer value so that a frequency difference between the initial free-running frequency divided by the integer value and the reference frequency is maintained at an approximately constant value, resulting in a controllable lock time that is independent of the integer divider value.

22. A method according to claim 21 wherein the frequency multiplier further comprises a current controlled charge pump and a filter connected thereto so that a bandwidth and a damping-factor of the PLL are also independent of the integer value for reducing jitter.

23. A method according to claim 21 wherein the VCO comprises a ring oscillator comprising a plurality of voltage-controlled delay elements connectable in a loop; and wherein the initial free-running frequency of the VCO is adjusted by varying the number of voltage-controlled delay elements connected in the loop.

24. A method according to claim 23 wherein the number of voltage-controlled delay elements is varied by selectively bypassing a required number of delay elements in the loop.

* * * * *

UNITED STATES PATENT AND TRADEMARK OFFICE
CERTIFICATE OF CORRECTION

PATENT NO. : 6,856,203 B2
DATED : February 15, 2005
INVENTOR(S) : Dey

It is certified that error appears in the above-identified patent and that said Letters Patent is hereby corrected as shown below:

Column 2,
Line 7, delete "$\theta = 0.7$" insert -- $\zeta = 0.7$ --
Line 7, delete "$\zeta$ n" insert -- $\omega_n$ --

Column 4,
Line 39, delete "by $\zeta$" insert -- by $\delta$ --
Line 60, delete "$K_{VCO}$ is the gain of the VCO, ICP"
insert -- $K_{VCO}$ is the gain of the VCO, $I_{CP}$ --

Signed and Sealed this

Nineteenth Day of July, 2005

JON W. DUDAS
*Director of the United States Patent and Trademark Office*